(12) United States Patent  
Lin et al.

(10) Patent No.: US 9,263,392 B1  
(45) Date of Patent: Feb. 16, 2016

(54) SEMICONDUCTOR DEVICE AND METHOD FOR FABRICATING THE SAME

(71) Applicant: UNITED MICROELECTRONICS CORP., Hsin-Chu (TW)

(72) Inventors: Ching-Ling Lin, Kaohsiung (TW); Chih-Sen Huang, Tainan (TW); Ching-Wen Hung, Tainan (TW); Jia-Rong Wu, Kaohsiung (TW); Tsung-Hung Chang, Yunlin County (TW); Yi-Hui Lee, Taipei (TW); Yi-Wei Chen, Taichung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/529,129

(22) Filed: Oct. 30, 2014

(30) Foreign Application Priority Data

Sep. 17, 2014 (CN) .......................... 2014 1 0474214

(51) Int. Cl.  
*H01L 21/336* (2006.01)  
*H01L 23/535* (2006.01)  
*H01L 29/78* (2006.01)  
*H01L 21/8234* (2006.01)  
*H01L 21/768* (2006.01)  
*H01L 21/02* (2006.01)  
*H01L 21/311* (2006.01)

(52) U.S. Cl.  
CPC .......... *H01L 23/535* (2013.01); *H01L 21/0217* (2013.01); *H01L 21/31144* (2013.01); *H01L 21/76802* (2013.01); *H01L 21/76877* (2013.01); *H01L 21/823475* (2013.01); *H01L 29/78* (2013.01)

(58) Field of Classification Search  
CPC ....................................................... H01L 29/49  
USPC .................................................... 438/19–217  
See application file for complete search history.

(56) References Cited

U.S. PATENT DOCUMENTS

| | | | |
|---|---|---|---|
| 8,536,040 B1 | 9/2013 | Park | |
| 8,741,717 B2 | 6/2014 | Hoon | |
| 2005/0277258 A1* | 12/2005 | Huang et al. | 438/300 |
| 2007/0099414 A1* | 5/2007 | Frohberg et al. | 438/618 |
| 2013/0320412 A1 | 12/2013 | Yamasaki | |
| 2014/0273386 A1* | 9/2014 | Tsao et al. | 438/301 |

* cited by examiner

*Primary Examiner* — Brook Kebede  
(74) *Attorney, Agent, or Firm* — Winston Hsu; Scott Margo

(57) ABSTRACT

A method for fabricating semiconductor device is disclosed. The method includes the steps of: providing a substrate having a metal gate thereon and an interlayer dielectric (ILD) layer around the metal gate; removing part of the metal gate to form a recess; and depositing a mask layer in the recess and on the ILD layer while forming a void in the recess.

24 Claims, 4 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a metal gate process.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, particularly during the stage for fabricating self-aligned contacts (SAC), part of the metal gates are typically removed and a protective mask layer is formed on the metal gates. The deposited protective mask layer is then planarized through chemical mechanical polishing (CMP) process so that the surface of the remaining mask layer is even with the surface of the interlayer dielectric (ILD) layer. This design however causes contact plugs formed thereafter to be too close to the metal gates thereby affecting performance of the device. Hence, how to improve the current process for fabricating metal gates for resolving this issue has become an important task in this field.

SUMMARY OF THE INVENTION

According to a preferred embodiment of the present invention, a method for fabricating semiconductor device is disclosed. The method includes the steps of: providing a substrate having a metal gate thereon and an interlayer dielectric (ILD) layer around the metal gate; removing part of the metal gate to form a recess; and depositing a mask layer in the recess and on the ILD layer while forming a void in the recess.

According to another aspect of the present invention, a method for fabricating semiconductor device is disclosed. The method includes the steps of: providing a substrate having a metal gate thereon and an interlayer dielectric (ILD) layer around the metal gate; removing part of the metal gate to form a recess; depositing a mask layer in the recess and on the ILD layer; and performing a planarizing process to remove part of the mask layer so that the top surface of the remaining mask layer is higher than the top surface of the ILD layer.

According to another aspect of the present invention, a semiconductor device is disclosed. The semiconductor device includes: a substrate; a metal gate on the substrate; an interlayer dielectric (ILD) layer around the metal gate; a mask layer on the metal gate and the ILD layer; and a void in the mask layer and above the metal gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
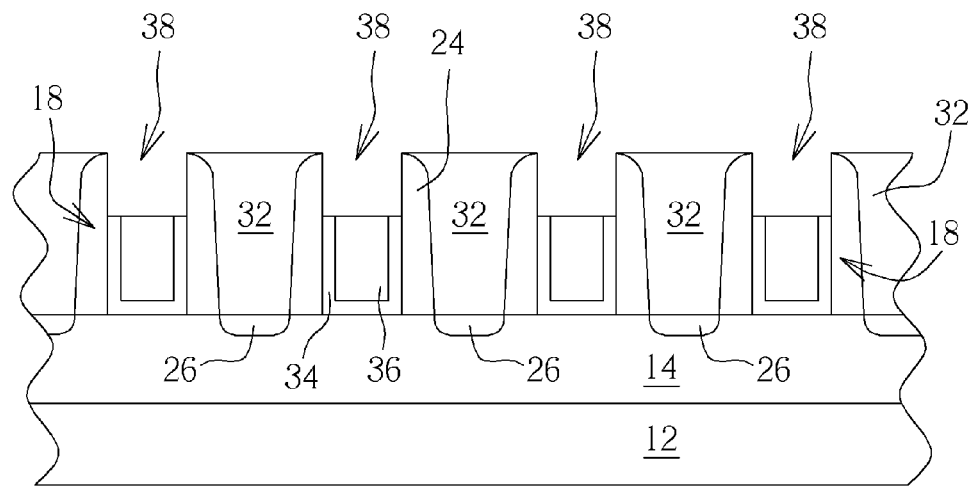
FIGS. 1-5 illustrate a method for fabricating semiconductor device according to a preferred embodiment of the present invention.

Referring to FIGS. 1-5, FIGS. 1-5 illustrate a method for fabricating semiconductor device according to a preferred embodiment of the present invention. As shown in FIG. 1, a substrate 12, such as a silicon substrate or silicon-on-insulator (SOI) substrate is provided, and a transistor region, such as a PMOS region or a NMOS region is defined on the substrate 12.

At least a first fin-shaped structure 14 and an insulating layer (not shown) are formed on the substrate 12, in which the bottom of the fin-shapes structure 14 is preferably enclosed by the insulating layer, such as silicon oxide to form a shallow trench isolation (STI). A plurality of metal gates 18 are formed on part of the fin-shaped structure 14. It should be noted that even though four metal gates are disclosed in this embodiment, the quantity of the metal gates is not limited to four, but could by any quantity depending on the demand of the product.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form an insulating layer to surround the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the insulating layer could be eliminated.

The fabrication of the metal gates 18 could be accomplished by a gate first process, a high-k first approach from gate last process, or a high-k last approach from gate last process. Since this embodiment pertains to a high-k first approach, dummy gates (not shown) composed of high-k dielectric layer and polysilicon material could be first formed on the fin-shaped structure 14 and the insulating layer, and a spacer 24 is formed on the sidewall of the dummy gates. A source/drain region 26 and epitaxial layer (not shown) are then formed in the fin-shaped structure 14 and/or substrate 12 adjacent to two sides of the spacer 24, a contact etch stop layer (CESL) (not shown) is formed on the dummy gates, and an interlayer dielectric (ILD) layer 32 composed of tetraethyl orthosilicate (TEOS) is formed on the CESL.

Next, a replacement metal gate (RMG) process could be conducted to planarize part of the ILD layer 32 and CESL and then transforming the dummy gates into metal gates. The RMG process could be accomplished by first performing a selective dry etching or wet etching process, such as using etchants including ammonium hydroxide (NH₄OH) or tetramethylammonium hydroxide (TMAH) to remove the polysilicon layer from dummy gates for forming a recess (not shown) in the ILD layer 32. Next, a conductive layer including at least a U-shaped work function metal layer 34 and a low resistance metal layer 36 is formed in the recess, and a planarizing process is conducted so that the surface of the U-shaped work function layer 34 and low resistance metal layer 36 is even with the surface of the ILD layer 32.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 34 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), tungsten (W), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Part of the metal gates 18, such as part of the work function metal layer 34 and low resistance metal layer 36 are then removed by etching process to form a recess 38 surrounded by the spacer 24 on each metal gate 18.

Figure 2:
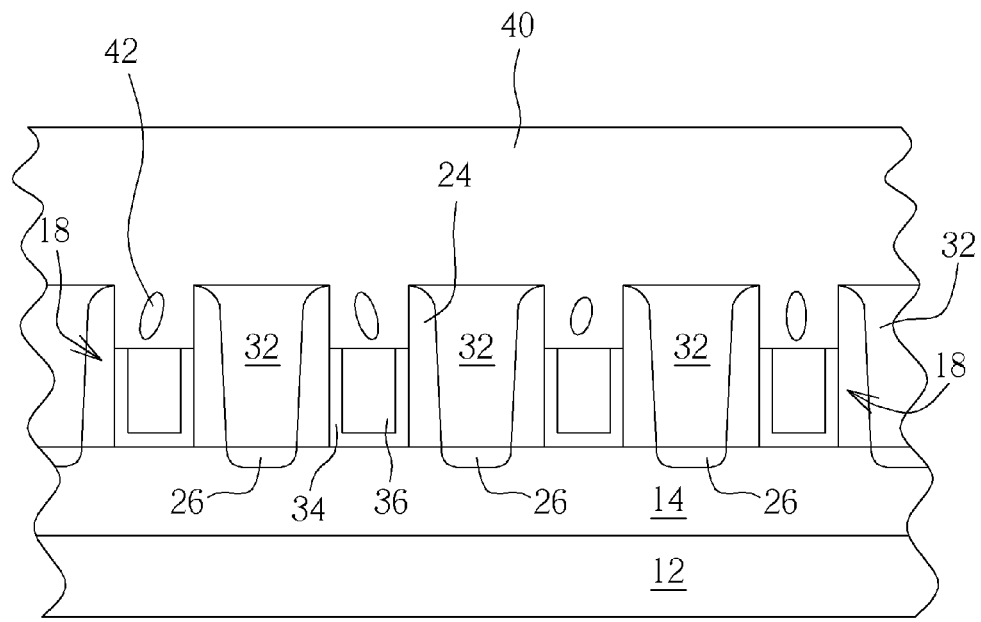

Next, as shown in FIG. 2, a mask layer 40 is deposited on the ILD layer 32 and the metal gate 18 to fill the recesses 38, in which the mask layer 40 is preferably composed of silicon nitride or silicon carbon nitride (SiCN), but not limited thereto. Preferably, as the mask layer 40 is covered on the ILD layer 32 and filled into each of the recesses 38, a void 42 is formed in each recess 38 within the mask layer 40. In this embodiment, the void 42 is preferably formed in the mask layer 40 above each metal gate 18 and lower than the top surface of the ILD layer 32.

Figure 3:
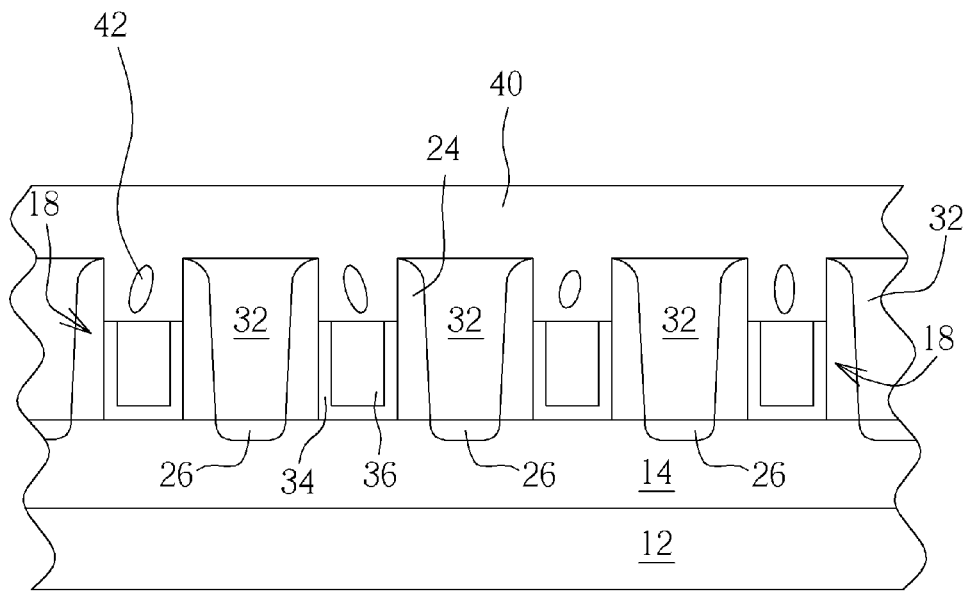

Next, as shown in FIG. 3, a planarizing process, such as a CMP process is conducted to remove part of the mask layer 40. Preferably, the mask layer 40 is planarized without reaching the surface of the ILD layer 32 so that the top surface of the remaining mask layer 40 is still higher than the top surface of the ILD layer 32.

Figure 4:
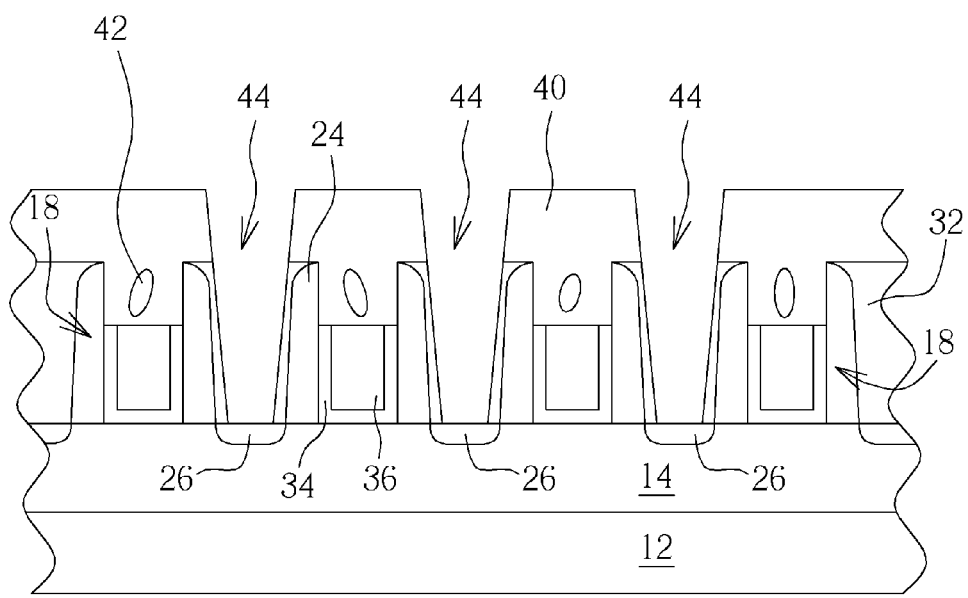

Next, as shown in FIG. 4, a photo-etching process is conducted by using a patterned resist (not shown) as mask to etch part of the mask layer 40 and ILD layer 32 for forming a plurality of contact holes 44 adjacent to each metal gate 18, in which the contact holes 44 preferably expose the source/drain region 26 in the substrate 12.

Figure 5:
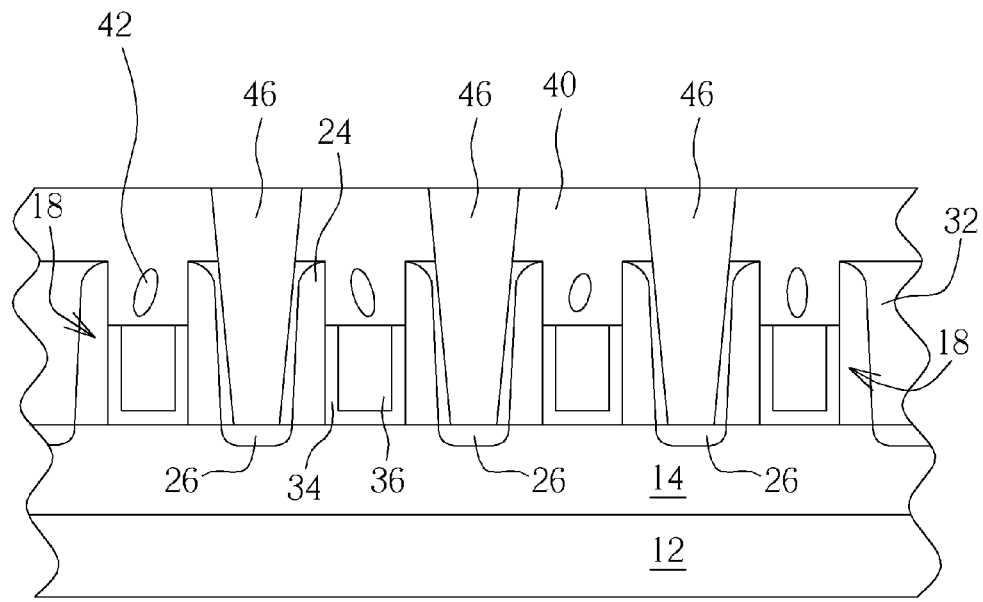

Next, as shown in FIG. 5, a metal is filled into the contact holes 44, and a planarizing process is conducted by removing part of the metal for forming a plurality of contact plugs 46. Since the fabrication of the contact plugs is well known to those skilled in the art, the details of which are not explained herein for the sake of brevity. This completes the fabrication of a semiconductor device according to a preferred embodiment of the present invention.

As the mask layer 40 is planarized without reaching the surface of the ILD layer 32 during the aforementioned planarizing process, the top surface of the remaining mask layer 40 would be substantially higher than the top surface of the ILD layer 32. In other words, the top of each spacer 24 is protected by the mask layer 40 so that the top portion of the spacers 24 would not be damaged during the planarizing process. Consequently, as shown in FIG. 5, the distance between the contact plugs 46 and the top surface of ILD layer 32 to the metal gates 18 could be extended so that issues regarding contact plugs being too close to the metal gates thereby affecting performance of the device could be prevented.

Referring again to FIG. 5, which further illustrates a structural view of a semiconductor device according to an embodiment of the present invention. As shown in FIG. 5, the semiconductor device includes a substrate 12, a plurality of metal gates 18 on the substrate 12, a ILD layer 32 surrounding the metal gates 18, a mask layer 40 on the metal gates 18 and ILD layer 32, and a void 42 in the mask layer 40 and above each metal gate 18.

In this embodiment, the void 42 is preferably lower than the top surface of the ILD layer 32, but not limited thereto. Depending on the recipe or deposition condition of the mask layer 40, the void 42 could also be formed in the mask layer 40 above the metal gate 18 while also higher than the top surface of the ILD layer 32, which is also within the scope of the present invention. A plurality of contact plugs 46 are also disposed adjacent to the metal gates 18 in the mask layer 40 and ILD layer 32 while electrically connected to the source/drain region 26 in the substrate 12.

Figure 6:
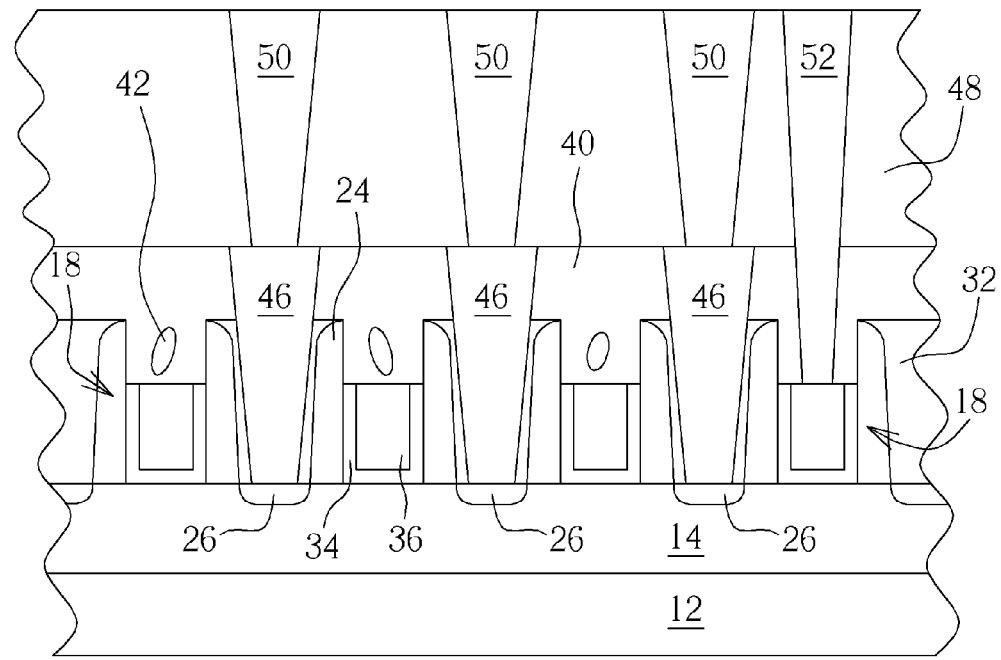
FIG. 6 illustrates a perspective view of a semiconductor device according to an embodiment of the present invention.

Referring to FIG. 6, FIG. 6 illustrates a perspective view of a semiconductor device according to an embodiment of the present invention. As shown in FIG. 6, another ILD layer 48 could be formed on the mask layer 40 after the contact plugs 46 are formed, contact plugs 50 could be formed in the ILD layer 48 to electrically connect to the contact plugs 46, and a contact plug 52 could be formed in the ILD layers 48 and 32 to electrically connect to the metal gate 18 directly. It should be noted that the void 42 would be filled during the formation of the contact plug 52 therefore would not be visible after the formation of the contact plug 52.

Figure 7:
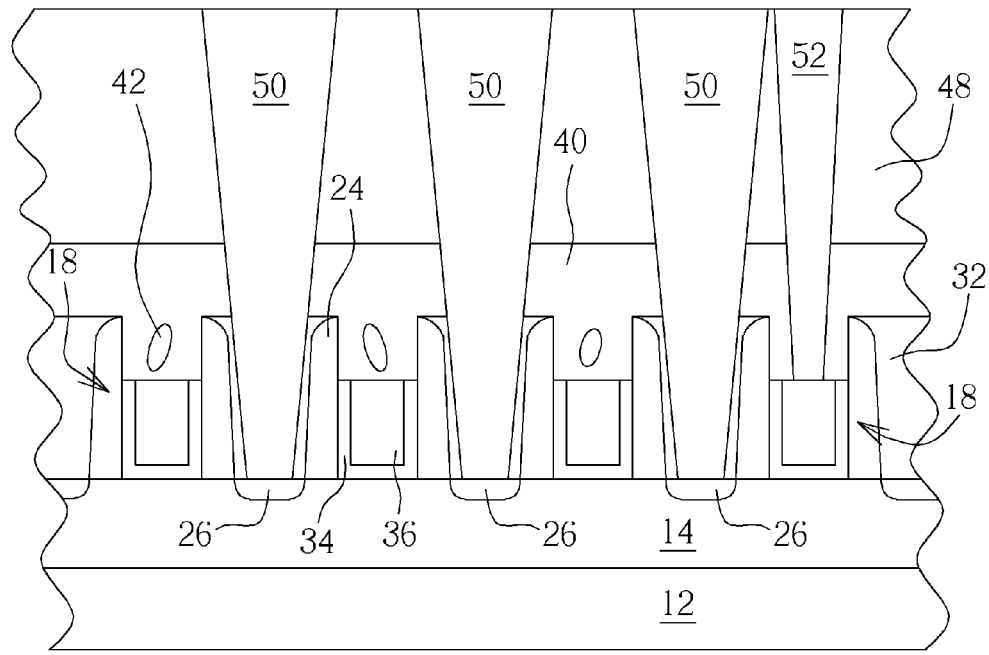
FIG. 7 illustrates a perspective view of a semiconductor device according to an embodiment of the present invention.

Referring to FIG. 7, FIG. 7 illustrates a perspective view of a semiconductor device according to an embodiment of the present invention. As shown in FIG. 7, another ILD layer 48 could be formed on the mask layer 40 while no contact plugs are formed, and contact plugs 50 and 52 could then be formed in the ILD layer 48, mask layer 40, and ILD layer 32 to electrically connect to the source/drain region 26 and metal gate 18 respectively.

Figure 8:
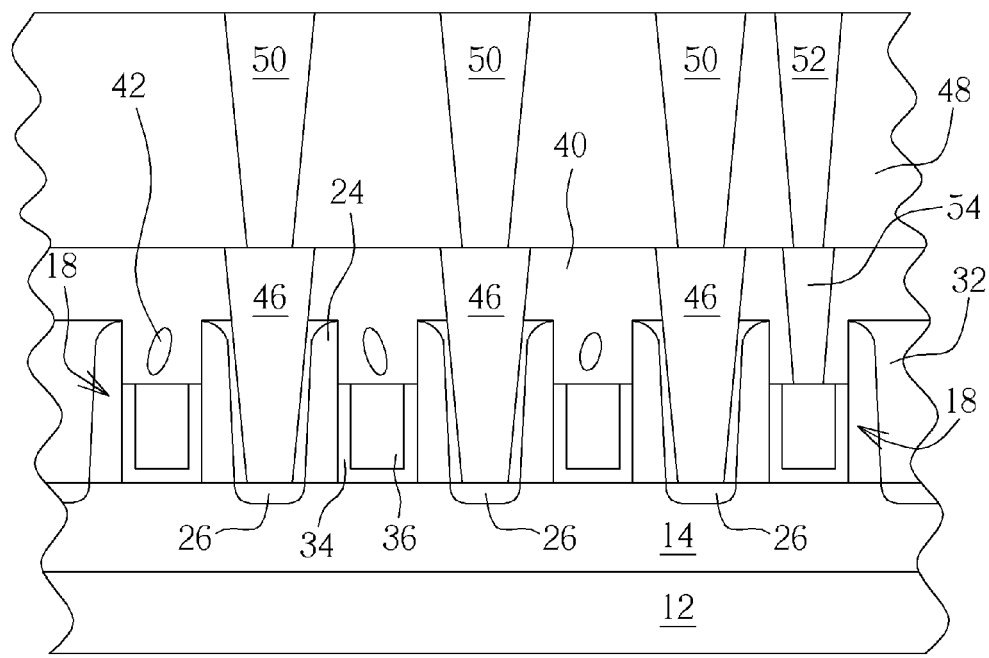
FIG. 8 illustrates a perspective view of a semiconductor device according to an embodiment of the present invention.

Referring to FIG. 8, FIG. 8 illustrates a perspective view of a semiconductor device according to an embodiment of the present invention. As shown in FIG. 8, contact plug 54 could be formed in the mask layer 40 to electrically connect to at least one metal gate 18 along with the contact plugs 46. Next, another ILD layer 48 could be formed on the mask layer 40, and contact plugs 50 and 52 could be formed in the ILD layer 48 to electrically connect to the contact plugs 46 and contact plug 54 respectively.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method for fabricating semiconductor device, comprising:
    providing a substrate having a metal gate thereon and a first interlayer dielectric (ILD) layer around the metal gate;
    removing part of the metal gate to form a recess; and
    depositing a mask layer in the recess and on the first ILD layer while forming a void in the recess.

2. The method of claim 1, wherein the mask layer comprises silicon nitride or silicon carbon nitride.

3. The method of claim 1, further comprising forming a first contact plug in the mask layer and the first ILD layer.

4. The method of claim 3, wherein the top surfaces of the mask layer and the first contact plug are coplanar.

5. The method of claim 3, further comprising:
    forming a second ILD layer on the mask layer and the first contact plug;
    forming a second contact plug in the second ILD layer and contacting the first contact plug; and
    forming a third contact plug in the mask layer and the second ILD layer and contacting the metal gate.

6. The method of claim 5, wherein the top surfaces of the second contact plug, the third contact plug, and the second ILD layer are coplanar.

7. The method of claim 1, further comprising:
    forming a second ILD layer on the mask layer;
    forming a first contact plug in the mask layer, the first ILD layer, and the second ILD layer; and
    forming a second contact plug in the mask layer and the second ILD layer and contacting the metal gate.

8. The method of claim 7, wherein the top surfaces of the first contact plug, the second contact plug, and the second ILD layer are coplanar.

9. The method of claim 3, further comprising:
    forming a second contact plug in the mask layer and contacting the metal gate;
    forming a second ILD layer on the mask layer, the first contact plug, and the second contact plug;
    forming a third contact plug in the second ILD layer and contacting the first contact plug; and
    forming a fourth contact plug in the second ILD layer and contacting the second contact plug.

10. The method of claim 9, wherein the top surfaces of the first contact plug, the second contact plug, and the mask layer are coplanar.

11. The method of claim 9, wherein the top surfaces of the third contact plug, the fourth contact plug, and the second ILD layer are coplanar.

12. A semiconductor device, comprising:
    a substrate;
    a metal gate on the substrate;
    a first interlayer dielectric (ILD) layer around the metal gate;
    a mask layer on the metal gate and the first ILD layer; and
    a void in the mask layer and above the metal gate.

13. The semiconductor device of claim 12, wherein the mask layer comprises silicon nitride or silicon carbon nitride.

14. The semiconductor device of claim 12, wherein the void is lower than the top surface of the first ILD layer.

15. The semiconductor device of claim 12, further comprising a first contact plug in the mask layer and the first ILD layer.

16. The semiconductor device of claim 15, wherein the top surfaces of the mask layer and the first contact plug are coplanar.

17. The semiconductor device of claim 15, further comprising:
    a second ILD layer on the mask layer and the first contact plug;
    a second contact plug in the second ILD layer and contacting the first contact plug; and
    a third contact plug in the mask layer and the second ILD layer and contacting the metal gate.

18. The semiconductor device of claim 17, wherein the top surfaces of the second contact plug, the third contact plug, and the second ILD layer are coplanar.

19. The semiconductor device of claim 12, further comprising:
    a second ILD layer on the mask layer;
    a first contact plug in the mask layer, the first ILD layer, and the second ILD layer; and
    a second contact plug in the mask layer and the second ILD layer and contacting the metal gate.

20. The semiconductor device of claim 19, wherein the top surfaces of the first contact plug, the second contact plug, and the second ILD layer are coplanar.

21. The semiconductor device of claim 15, further comprising:
    a second contact plug in the mask layer and contacting the metal gate;
    a second ILD layer on the mask layer, the first contact plug, and the second contact plug;
    a third contact plug in the second ILD layer and contacting the first contact plug; and
    a fourth contact plug in the second ILD layer and contacting the second contact plug.

22. The semiconductor device of claim 21, wherein the top surfaces of the first contact plug, the second contact plug, and the mask layer are coplanar.

23. The semiconductor device of claim 21, wherein the top surfaces of the third contact plug, the fourth contact plug, and the second ILD layer are coplanar.

24. The semiconductor device of claim 12, wherein the top surface of the mask layer is higher than the top surface of the metal gate.

* * * * *